United States Patent
Shew et al.

(10) Patent No.: US 8,327,598 B2
(45) Date of Patent: Dec. 11, 2012

(54) MODULAR BLOCKING PANEL SYSTEMS FOR RACKS AND CABINETS

(75) Inventors: Robert Scott Shew, San Clemente, CA (US); Todd P. Schneider, Monroe, CT (US); Reginald E. Jonker, Cerritos, CA (US)

(73) Assignee: Electrorack Products Company, Anaheim, CA (US)

( * ) Notice: Subject to any disclaimer, the term of this patent is extended or adjusted under 35 U.S.C. 154(b) by 552 days.

(21) Appl. No.: 12/498,313

(22) Filed: Jul. 6, 2009

(65) Prior Publication Data

US 2010/0000953 A1    Jan. 7, 2010

Related U.S. Application Data

(60) Provisional application No. 61/148,900, filed on Jan. 30, 2009, provisional application No. 61/078,737, filed on Jul. 7, 2008.

(51) Int. Cl.
*E04C 3/00* (2006.01)

(52) U.S. Cl. ........ 52/578; 52/589.1; 160/229.1; 428/61; 428/99; 49/464; 16/225

(58) Field of Classification Search ................. 211/183, 211/175, 207, 208, 169, 26; 312/265.1–265.4, 312/109, 327, 328, 138.1, 223.2; 256/60, 256/67, 24, 26; 49/464; 160/229.1, 235, 160/135; 428/57, 60, 61, 99; 446/120, 121, 446/124, 125; 434/413, 414; 52/578, 589.1; 16/225, 227

See application file for complete search history.

(56) References Cited

U.S. PATENT DOCUMENTS

| | | | | | |
|---|---|---|---|---|---|
| 2,702,866 | A | * | 2/1955 | Anderson | 256/25 |
| 3,092,870 | A | * | 6/1963 | Baer | 16/277 |
| 3,441,975 | A | * | 5/1969 | Shepherd | 16/225 |
| 3,485,287 | A | * | 12/1969 | Milbourne, Sr. | 160/235 |
| 3,516,114 | A | * | 6/1970 | Joyce | 16/225 |
| 3,570,579 | A | * | 3/1971 | Matsushima | 160/235 |
| 4,290,633 | A | * | 9/1981 | Sullivan | 292/114 |
| 4,338,990 | A | * | 7/1982 | Blodee et al. | 160/229.1 |
| 4,509,930 | A | * | 4/1985 | Schweigert et al. | 446/109 |
| 4,694,965 | A | * | 9/1987 | Parnell | 211/87.01 |
| 4,914,874 | A | * | 4/1990 | Graham, Jr. | 52/79.1 |
| 4,915,460 | A | * | 4/1990 | Nook et al. | 312/138.1 |
| 5,269,597 | A | * | 12/1993 | Yenglin et al. | 312/42 |
| 5,718,276 | A | * | 2/1998 | Rekret | 160/201 |
| 5,909,762 | A | * | 6/1999 | Denoual et al. | 160/201 |
| 6,006,815 | A | * | 12/1999 | Schanz | 160/133 |

(Continued)

OTHER PUBLICATIONS

HP Invent Catalog, J1514A1 and J4387A HP filler Panels Technical Data, 1 page, No date given.

(Continued)

*Primary Examiner* — Teri P. Luu
*Assistant Examiner* — Devin Barnett
(74) *Attorney, Agent, or Firm* — Snell & Wilmer, LLP

(57) ABSTRACT

The disclosure generally relates to a modular blocking panel system for a rack. The modular blocking panel system consists of multiple standardized panels which snap-together, or slidably attach to one another, in order to fill openings of any size in a rack. The panels connect to one another so that there is a seal at the junction between the panels. The seal blocks hot air in the interior of the rack from seeping through the panels and mixing with the cold air supply on the exterior of the panels. Multiple panels can be combined to create a single modular panel to cover any sized opening.

19 Claims, 11 Drawing Sheets

U.S. PATENT DOCUMENTS

| | | | | |
|---|---|---|---|---|
| 6,041,847 | A * | 3/2000 | Lai | 160/236 |
| 6,129,132 | A * | 10/2000 | Denoual et al. | 160/235 |
| 6,223,804 | B1 * | 5/2001 | Toti | 160/199 |
| 6,378,172 | B1 * | 4/2002 | Schrage | 16/366 |
| 6,510,589 | B2 * | 1/2003 | Schrage | 16/366 |
| 6,513,862 | B2 * | 2/2003 | Dodson et al. | 296/155 |
| 6,590,848 | B1 * | 7/2003 | Chen | 720/654 |
| 6,597,576 | B1 * | 7/2003 | Smith et al. | 361/724 |
| 6,758,353 | B2 * | 7/2004 | Orr | 211/183 |
| 6,951,237 | B2 * | 10/2005 | Mullet | 160/201 |
| 7,234,688 | B1 * | 6/2007 | Asenbauer | 256/26 |
| 7,370,682 | B2 * | 5/2008 | Wong | 160/133 |
| 7,770,623 | B2 * | 8/2010 | Wong | 160/133 |
| 7,784,522 | B2 * | 8/2010 | Miller | 160/235 |
| 8,024,839 | B2 * | 9/2011 | Lewis, II | 16/266 |
| 2002/0059988 | A1 * | 5/2002 | Mochizuki et al. | 160/235 |
| 2004/0159067 | A1 * | 8/2004 | Perkins et al. | 52/588.1 |
| 2004/0168777 | A1 * | 9/2004 | Kelley | 160/229.1 |
| 2005/0072089 | A1 * | 4/2005 | Wong | 52/473 |
| 2006/0070321 | A1 * | 4/2006 | Au | 52/232 |
| 2006/0243691 | A1 * | 11/2006 | Verdicchio | 211/169 |
| 2006/0260768 | A1 * | 11/2006 | Svenson | 160/235 |
| 2007/0012409 | A1 * | 1/2007 | Twina | 160/235 |
| 2007/0137802 | A1 * | 6/2007 | Lukasik et al. | 160/235 |
| 2009/0059486 | A1 * | 3/2009 | Taylor | 361/679.02 |

OTHER PUBLICATIONS

Hoffman Product Instructions, 1 page, copyright 2007.
PlenaFill 27 U Blanking Panel, 1 page, no date given.
APC Toolless Blanking Panel (AR8136BLK and AR8136BLK200) Installation, 2 pages, Oct. 2006.
Chatsworth Products, Inc., Product Data Sheet, Snap-In Filler Panels, 2 pages, copyright 2009.
Hotlok Blanking Panel Product Guide, 3 pages, copyright 2008.
The Hotlok Blanking Panel Basics from the Research & Development Department at Upsite Technologies, 2 pages, copyright 2008.

* cited by examiner

MODULAR BLOCKING PANEL SYSTEMS FOR RACKS AND CABINETS

CLAIM OF PRIORITY UNDER 35 U.S.C. §119

The present Application for Patent claims priority to Provisional Application No. 61/148,900 filed Jan. 30, 2009, and 61/078,737 filed Jul. 7, 2008, both entitled "Modular Panel System for Racks and Cabinets," both of which are assigned to the assignee hereof and hereby expressly incorporated by reference herein.

BACKGROUND

1. Field

The invention relates to blocking panels for use with racks and cabinets for storing electronic equipment. More specifically, the invention relates to modular blocking panel systems configured to fill openings of any size for racks and cabinets.

2. Related Art

Datacenters that house electronic equipment, such as servers, networking equipment, and computers, have high thermal cooling requirements so that the equipment does not overheat and malfunction. In traditional datacenters, racks or cabinets are arranged in a hot/cold aisle arrangement as shown in FIG. 1. In this layout, the cool air enters sides 102 and the hot air exhausts sides 104. The cold air supply 110 for the room is positioned to deliver cold air to the cold aisle 106 and the hot air return 112 is positioned to draw hot air from the hot aisles 108. The cold air supply 110 can be positioned on the ceiling, on the floor, or on a wall unit, or any combination thereof. The hot air return 112 can be positioned on the ceiling, on the floor, or a return unit at the end of each row, or any combination thereof. This layout eliminates the direct transfer of hot exhaust air from one system into the intake air of another system. The efficiency of the system is greatly improved if air in the cold air aisle 106 and hot air aisle 108 can be kept from mixing.

Blocking panels can greatly enhance the ability to segregate the hot and cold air. Blocking panels are placed in the open front portion of each rack in places where no equipment is mounted. These blocking panels prevent hot air from recirculating through the rack from the hot air exhaust side to the front cold air intake side of the rack. Blocking panels are also referred to as "blanking panels" and "filler panels."

Blocking panels are designed in various sizes based on the Electronics Industries Alliance (EIA) unit standard 1U, which equals 1.75 inches in height. This standard is intended to provide overall dimensional design requirements for electronic racks and cabinets that hold and store electronic equipment. Racks and cabinets, as well as the equipment they hold, are designed in multiples of 1U increments. As such, blocking panels are also typically designed in multiples of 1U increments. Blocking panels are supplied in various size increments to fill potential gaps that are in unused spaces of the racks. These increments can include, for example, 1U, 2U, 3U, 4U, 5U, 6U, etc. Therefore, to fill a 5U opening one could use a 5U panel, or install a separate 2U and 3U panel, a separate 1U and 4U panel, or any combination of panels that would total 5U. These panels are separate and need to be purchased and installed individually to fill the required opening.

In additional, traditional blocking panels do not completely block hot air from passing through the rack into the cold air supply, as the junctions between the blocking panels are not completely sealed. This allows hot air to seep through, wasting cold air utilization.

Therefore, a need exists for modular blocking panel systems that allow multiple panels having the same size to be attached to each other to create an airflow blocking system of any size that eliminates the above-mentioned drawbacks of conventional methods and devices.

SUMMARY

In one embodiment, the disclosure relates to a panel for use in an equipment rack, the panel including a body having a first male connector and a second male connector, a hinge having a first portion and a second portion, the first portion of the hinge connected to the body, a rotating hinged section connected to the second portion of the hinge, the rotating hinged section having an outer female connector and an inner female connector, the rotating hinged section movable between a closed position and an open position, and wherein the inner female connector is configured to attach to the first male connector when the rotating hinged section is in the closed position.

In another embodiment, the disclosure relates to a modular panel system including a first panel having a top male connector and a rotating hinged section, the rotating hinged section having an inner female connector and an outer female connector, and a second panel having a bottom male connector, wherein the rotating hinged section rotates between a first position where the inner female connector is removably connected to the top male connector of the first panel and a second position where the outer female connector is removably connected to the bottom male connector of the second panel.

In yet another embodiment, the disclosure relates to a rack filler panel comprising: a rectangular panel having a first edge and a second edge, the first edge has a first angled portion ending with a female connector and the second edge has a second angled portion ending with a cylindrical shaped male connector.

In yet another embodiment, the disclosure relates to a modular panel system comprising: a top panel having a first female connector; a central panel having a first male connector and a second male connector, the first male connector configured to be attached to the first female connector; and a bottom panel having a second female connector configured to be attached to the second male connector.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements.

Figure 1:
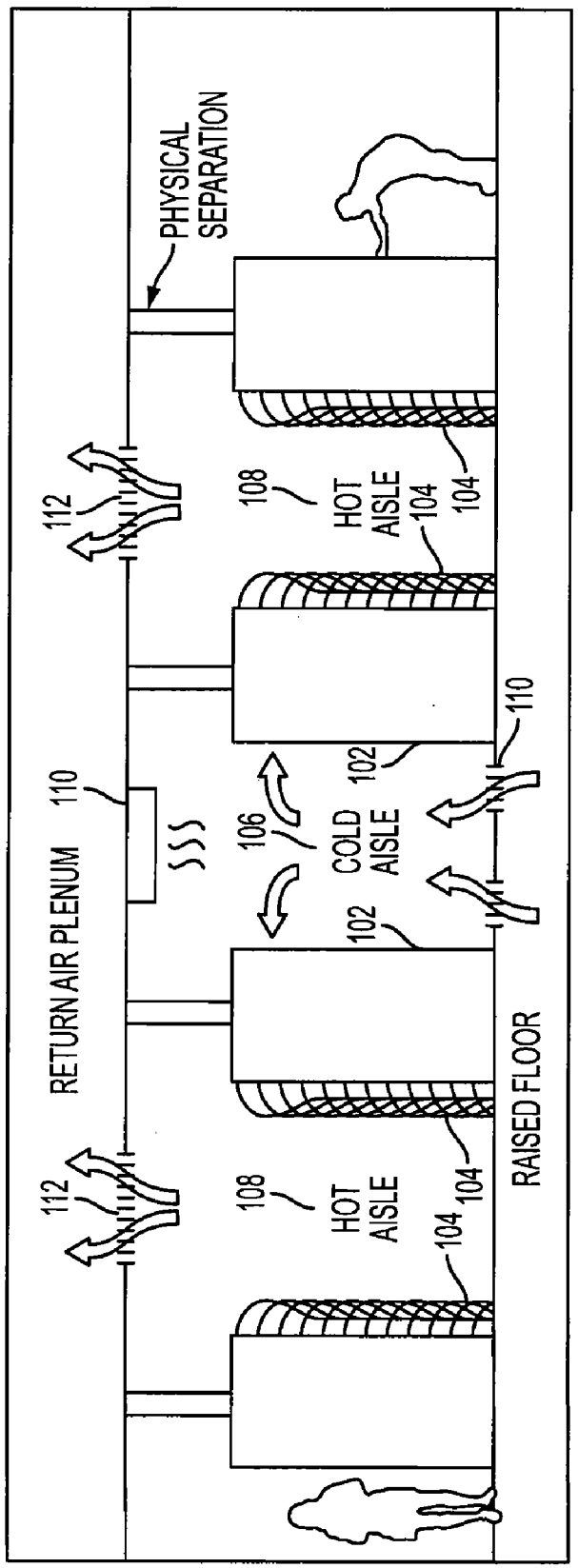
FIG. 1 is a view of a datacenter layout having a hot aisle/cold aisle arrangement.
Figure 2:
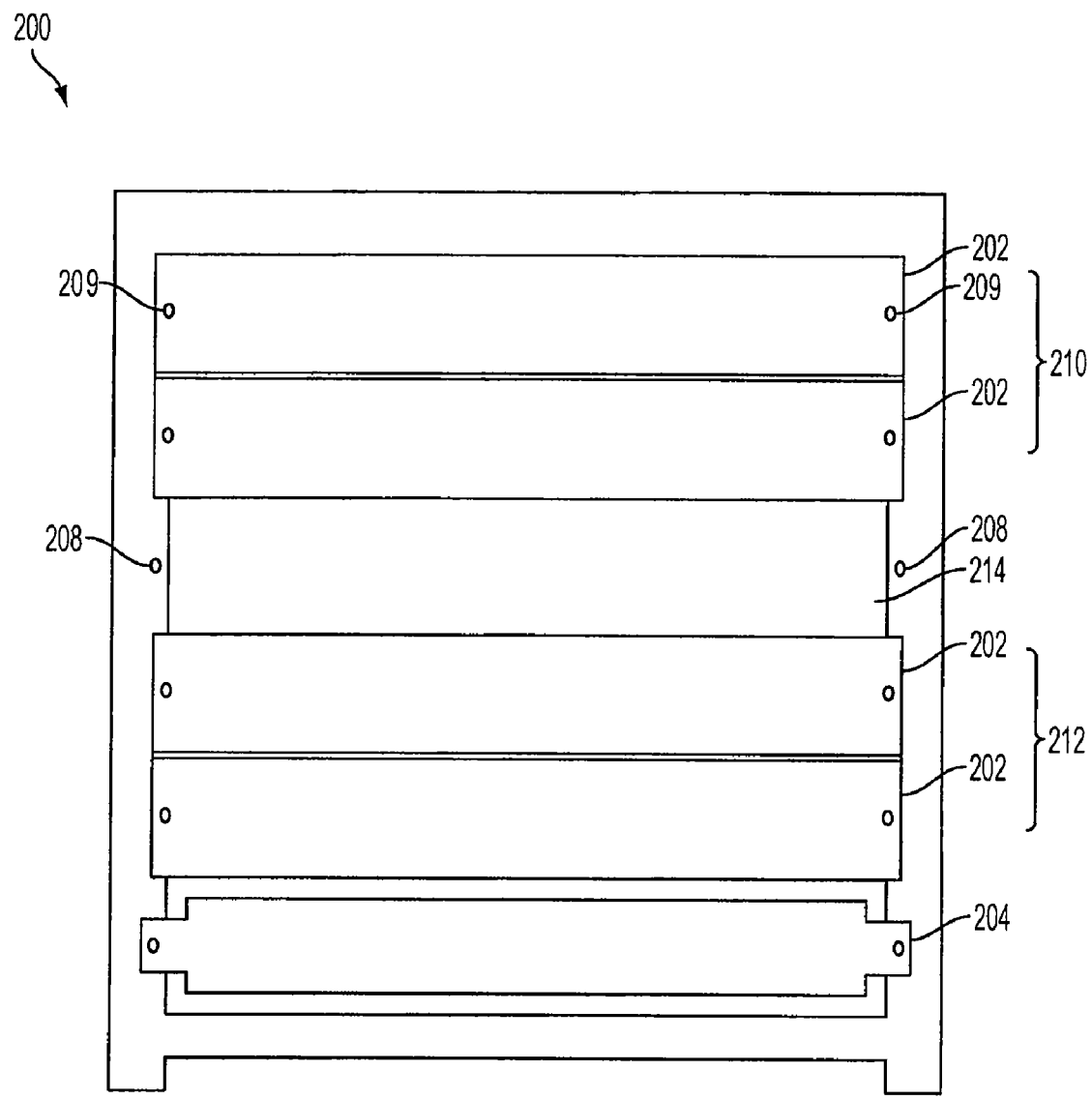
FIG. 2 is a view of a cabinet having a modular blocking panel system.

FIG. 2 is a view of a cabinet having a modular blocking panel system. The rack 200 can be a rack, cabinet, shelf system, or storage system configured to hold or mount equipment 204, such as servers, hard drives, networking devices, and other electronic hardware. Panels 202 are attached to the rack 200 via rivets, screws, nuts, bolts, or any other fastening devices that are inserted through rack openings 208. The panels 202 have openings 209.

In an embodiment, the equipment 204 is attached directly onto the rack openings 208. Thus, the rack 200 does not include shelves or compartments, which allows air to freely circulate throughout the rack. In another embodiment, the rack 200 can include shelves with perforations which allow air to flow between the different shelves in the rack 200.

In an embodiment, a standard fastening device is used to attach both the panels 202 and the equipment 204 to the rack openings 208. This eliminates the need to use multiple types of fasteners and fastening devices when replacing a panel 202 with equipment 204.

FIG. 2 depicts an embodiment with a first modular blocking panel system 210 and a second modular blocking panel system 212, each of the modular blocking panel systems including two separate 1U panels 202 connected to each other. In another embodiment, an additional 1U panel (not shown) can be attached to the first modular blocking panel system 210 to cover the rack space 214. The panels 202 generally cover or block the open space in the rack 200 where no equipment is present, such as in rack space 214. The modular blocking panels can be attached using fewer fasteners compared with attaching individual panels onto the rack 200.

Figure 3:
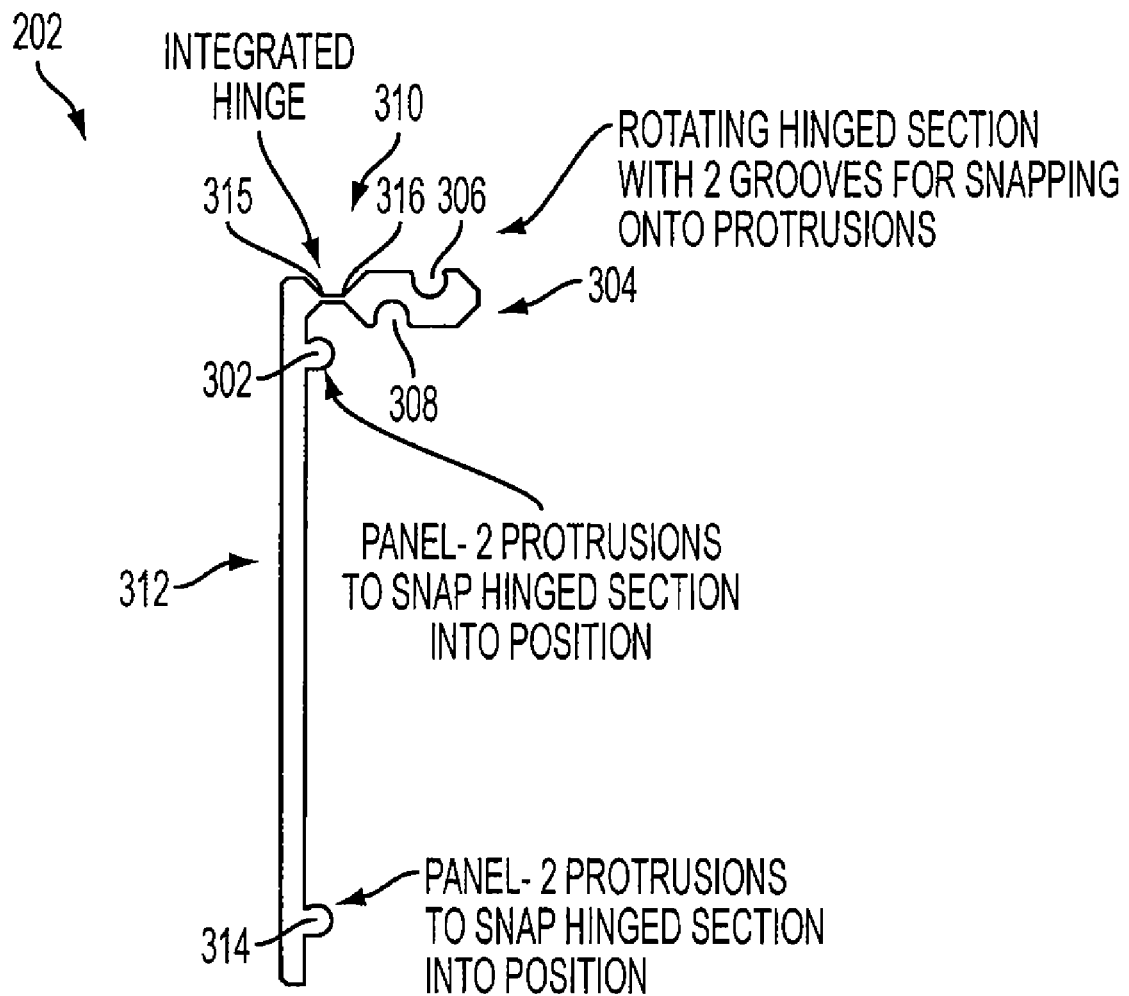
FIG. 3 is a view of a single panel with an open hinge.

FIG. 3 is a view of a single panel with an open hinge. In an embodiment, the panel 202 is an EIA standard unit 1U rectangular-shaped panel, where 1U is approximately 1.75 inches. However, the panel 202 can be of any dimension, such as 2U, 3U, 4U, 5U, 6U, etc., depending on the size and spacing of the rack that the modular blocking panel system is designed to be attached to. As shown, the panel 202 is a single one-piece device. The panel 202 includes a body 312 connected to a rotating hinged section 304 via an integrated hinge 310. The body 312 has a height of approximately 1.72 inches. The hinged section 304 and the integrated hinge 310 are designed to add 0.030 inches to the combined height of the panel 202 when attached to the body 312. This keeps the overall dimension consistent with the EIA standard of 1.75 inch increments.

The body 312 is connected to the hinge 310 at a first hinge portion 315. The rotating hinged section 304 is connected to the hinge 310 at a second hinge portion 316. The hinge 310 is made from a flexible material that allows the rotating hinged section 304 to move between a first closed position and a second open position.

In an embodiment, the panel 202, the hinge 310, and the rotating hinged section 304 are a single one-piece device made from a thermoplastic material, such as, but not limited to, acrylonitrile butadiene styrene, chlorinated polyvinyl chloride, chlorinated polyvinylidine chloride, polyphenylene oxide-styrene, plexiglass, high-density polyethylene, or a polypropylene compound. The panel 202, the hinge 310, and the rotating hinged section 304 can be made from the same material, or alternatively, can each be made from different materials. For example, the hinge 310 can be made from a flexible material, while the panel 202 and the rotating hinged section 304 can be made from a more rigid material, such as a strong plastic material or a metallic material.

In an embodiment, the rotating hinged section 304 includes an outer female connector 306 and an inner female connector 308, and is formed in the shape of a backwards "S". The panel 202 includes a top male connector 302 and a bottom male connector 314. The top male connector 302 snap-fits into the inner female connector 308 when the rotating hinged section 304 is in a closed position, thereby storing the rotating hinged section 304 in place when it is not needed to connect to additional panels, and further maintaining the 1.72 standard dimension for a single panel. The bottom male connector 314 can snap-fit into an outer female connector of another panel (see FIG. 4), allowing multiple panels to be connected to one another to create a modular blocking panel system. Likewise, the outer female connector 306 can snap-fit around or into a bottom male connector of another panel (see FIG. 4).

In an embodiment, the body 312 has a thickness between about 0.010 inches and about 1.0 inch, and preferably, the body 312 has a thickness of about 0.060 inches. The panel 202 has a height of between about 0.5 inches and about 5.0 inches, and preferably, the panel 202 has a height of about 1.75 inches, to conform to EIA spacing standards. The thickness and size of the panel 202 allows multiple panels to be shipped and transported in a flat and stacked configuration, thus minimizing storage space.

Figure 4:
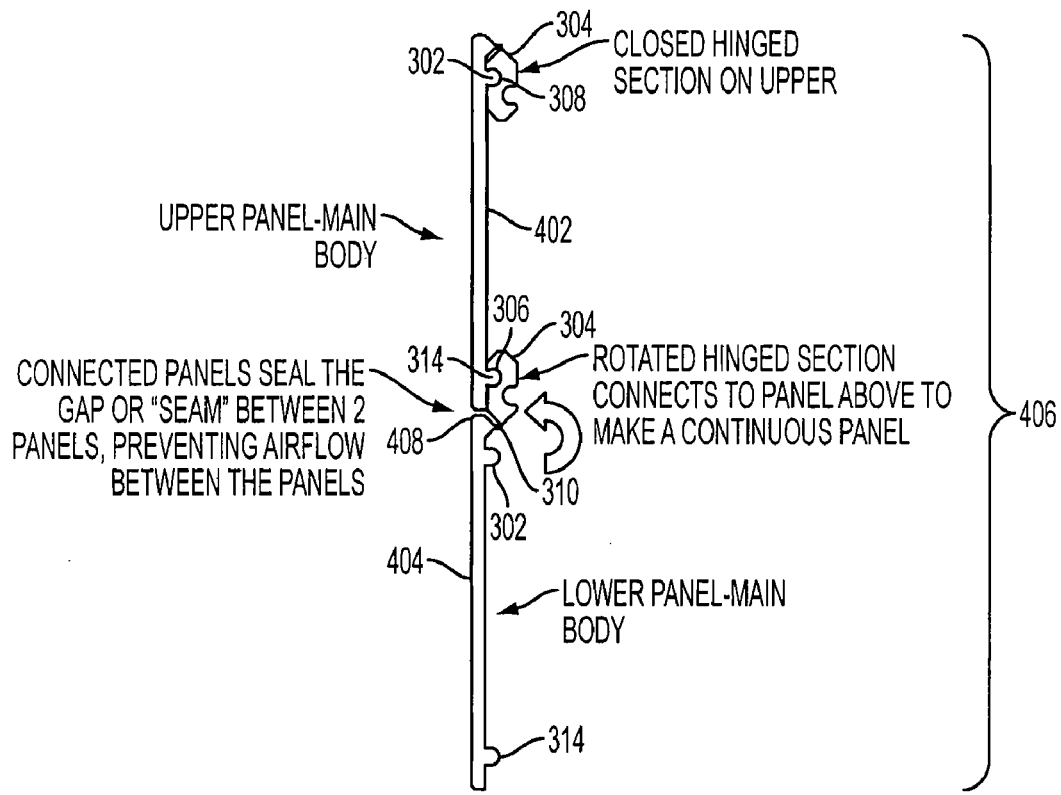
FIG. 4 is a side view of a modular blocking panel system.

FIG. 4 is a side view of multiple panels connected together. A first panel 402 is attached to a second panel 404 by inserting the bottom male connector 314 of the first panel 402 into the outer female connector 306 of the rotating hinged section 304 of the second panel 404. The first panel 402 and the second panel 404 create a continuous blocking panel 406. The rotating hinged section 304 of the second panel 404 overlaps with the first panel 402, creating a seal at the junction 408 of the first panel 402 and the second panel 404. The seal prevents unwanted hot exhaust air from flowing or seeping through the junction 408 and mixing with the cold air supply, or recirculating to the cold air intake of the rack 200. Failure to utilize panels 202 can lead to increased equipment operating temperatures, which can eventually lead to equipment malfunction. The 0.030 inch combined height of the rotating hinged section 304 and the integrated hinge 310 is designed to fill the gap at the junction 408. This gap is required for tolerance stack up by the EIA standard for panels.

In an embodiment, when the rotating hinged section 304 of the first panel 402 is not in use (e.g. not being connected to another panel), the rotating hinged section 304 can be moved to a closed position. The inner female connector 308 of the rotating hinged section 304 of the first panel 402 is snap-fitted around the top male connector 302 of the first panel 402, closing the rotating hinged section 304 on the first panel 402. In the closed position, the rotating hinged section 304 does not move and is flush against the body 312.

Figure 5:
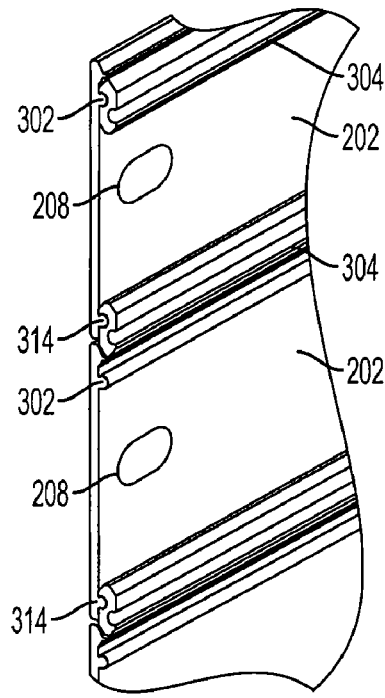
FIG. 5 is a perspective view of a modular blocking panel system.

FIG. 5 is a perspective view of a modular blocking panel system. Any number of panels 202 can be connected together to cover a desired opening in a rack. In an embodiment, multiple 1U panels are connected together to form one continuous blocking panel that can be configured to fit any rack opening size. As equipment is added or removed, panels 202 can be easily separated, or additional panels can be added or connected to the existing panels 202 as required. As described above, the rack openings 208 are used to attach the panels 202 to the cabinet. In an embodiment, the panels 202 are reusable, replaceable, and can be interchanged between different racks, eliminating the need for cutting panels to make them a desired size. In an embodiment, each of panels 202 in the modular blocking panel system has the same size, thereby simplifying rack blocking for an entire dataroom, and facilitating ordering and stocking of panels of various sizes. In an embodiment, the rotating hinged section 304, the outer female connector 306, the inner female connector 308, the top male connector 302 and the bottom male connector 314 extend the entire length of the body 312.

Figure 6:
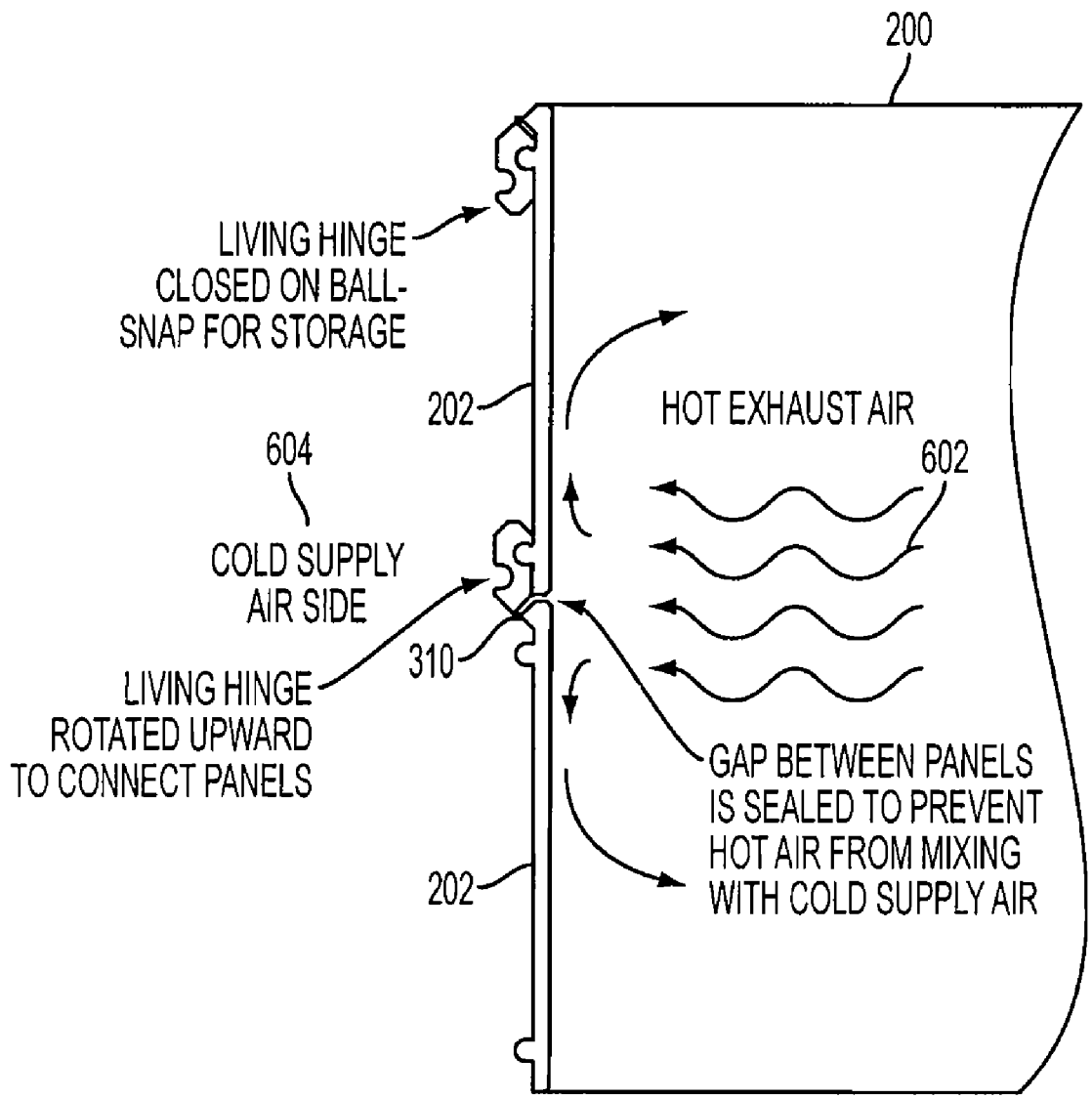
FIG. 6 is a side view of a modular blocking panel system.

FIG. 6 is a side view of a modular blocking panel system. The panels 202 are connected to one another as described above, covering an open space in the rack 200. Typically, there is no equipment mounted directly behind a panel. The panels 202 are mounted over open spaces between the equipment. The interior portion 602 of the rack 200 houses equipment, which generates hot exhaust air. The exterior 604 of the rack 200 contains a cold air flow. The hinge 310 provides a seal between the panels 202, so that hot exhaust air from the interior portion 602 is prevented from mixing with the cold air flow on the exterior 604. Prevention of hot air circulation to the cold air flow, which is used for cold air intake purposes to cool the equipment in the rack 200, is important to proper equipment operation in the dataroom.

Figure 7:
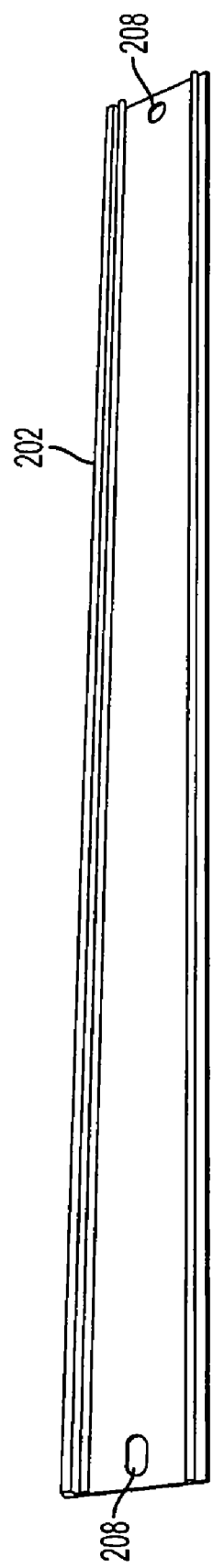
FIG. 7 is a view of a single panel.

FIG. 7 is a view of a single panel. In an embodiment, the panel 202 has rack openings 208 on each opposing side of the panel 202. In another embodiment, the panel 202 can have multiple openings on each side or openings on just one side. The rack openings 208 can have a circular, square, oval, rectangle, triangle, or any other geometric shape. In an embodiment, the panel 202 has a length between about 5.0 inches and about 100.0 inches, and preferably, the panel 202 has a length of about 19.0 inches to conform to EIA size standards. The panel 202 is preferably compatible with any style 19.0 inch EIA equipment mounting angles. Furthermore, the panel 202 is made of a fire-retardant or fire-rated material, such as, but not limited to, UL94V-0, and is compliant with the Restriction of Hazardous Substances Directive (RoHS).

In an embodiment, the panels 202 are designed with "knock-out" openings. The openings are semi-perforated, and are easily punched, pushed, or knocked out of the panel 202, so that the openings can be used to attach the panels 202 to the rack 200.

Figure 8:
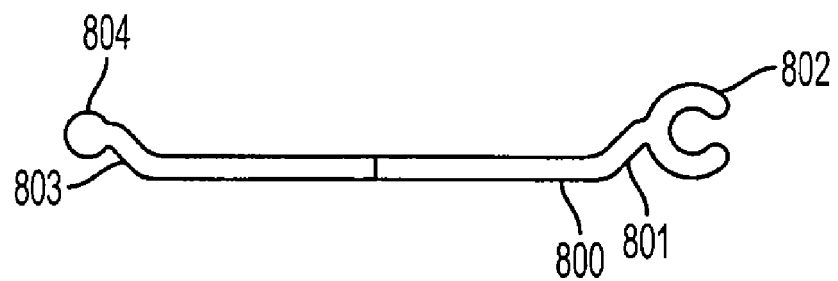
FIG. 8 is a view of a single panel having ball and snap connecting devices.

FIG. 8 is a view of a single panel having ball and snap connecting devices. The panel 800 has a female connector 802, which can be a socket or a groove, and a male connector 804, such as a ball or a protrusion. The female connector 802 is designed to receive a corresponding ball from another panel (see FIG. 9). The male connector 804 is designed to be inserted into a corresponding female connector from another panel (see FIG. 9). The female connector 802 and the male connector 804 allow the panel 800 to be connected to other panels to create a continuous blocking panel, without the use of additional hardware or tools. The panel 800 may have a first angled portion 801 adjacent to the female connector 802 and a second angled portion 803 adjacent to the male connector 804. The angled portions 801 and 803 make it easier to connect (either via snap-fit or sliding means) the female connector of one panel to the male connector of another panel.

Figure 9:
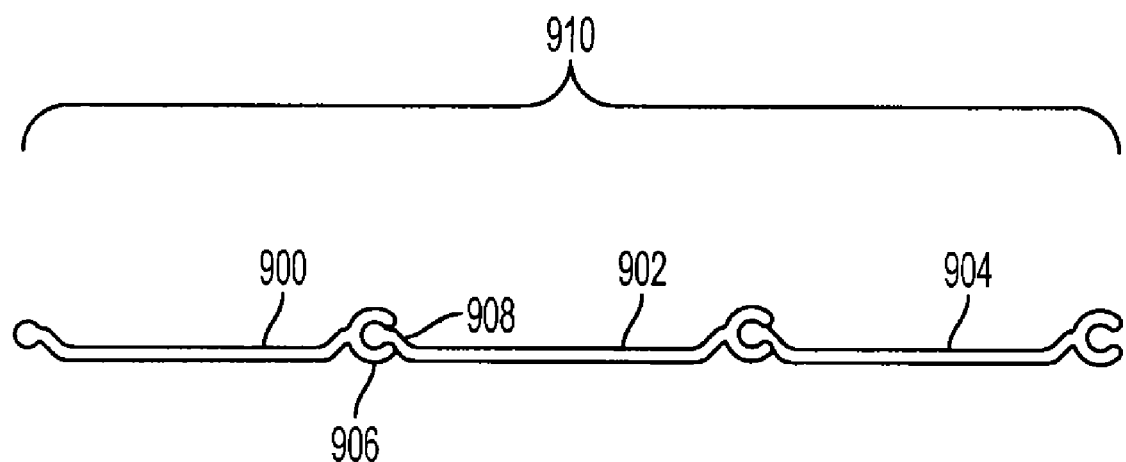
FIG. 9 is view of modular blocking panel system having ball and snap connecting devices.

FIG. 9 is view of a modular blocking panel system having ball and snap connecting devices. In an embodiment, three 1U panels are connected together to form a continuous blocking panel 910. The first panel 900 has a female connector 906 that is attached to a male connector 908 of the second panel 902. The male connector 908 can be snapped or pushed into the female connector 906 to secure the first panel 900 and the second panel 902 together. In another embodiment, the male connector 908 can slide into the female connector 906.

Figure 10:
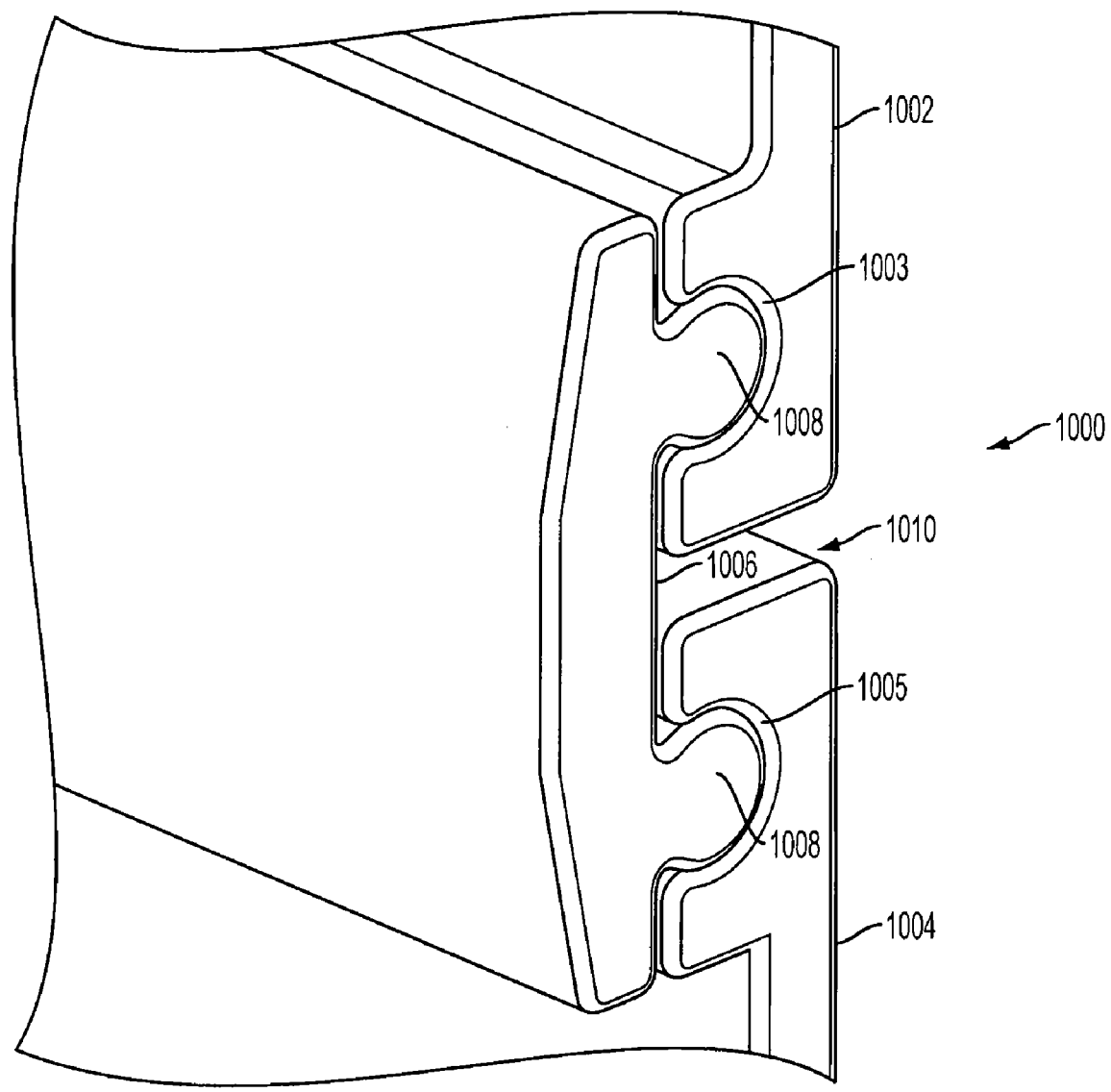
FIG. 10 is a view of a connecting device for a modular blocking panel system having dual male connectors.

FIG. 10 is a view of a connecting device for a modular blocking panel system having dual male connectors. The modular blocking panel system 1000 includes a top panel 1002 having a female connector 1003 and a bottom panel 1004 having a female connector 1005. Between the top panel 1002 and the bottom panel 1004 is a central panel 1006 having at least two male connectors 1008, which can be circular, rounded or ball-shaped. Each male connector 1008 is configured to snap-fit or slidably attach with the respective receiving female connectors 1003 and 1005. In a preferred embodiment, the central panel 1006 includes a first male connector and a second male connector, wherein the first male connector is configured to be attached to female connector 1003 on the top panel 1002, and wherein the second male connector is configured to be attached to female connector 1005 on the bottom panel 1004.

The central panel 1006 overlaps the top panel 1002 and the bottom panel 1004, and creates a seal at the junction 1010 between the top panel 1002 and the bottom panel 1004. The seal prevents unwanted hot exhaust air from flowing or seeping through the junction 1010 and mixing with the cold air supply, or re-circulating to the cold air intake of the rack. In another embodiment, the male connectors 1008 can have a square, oval, rectangular, or other geometric shape.

Figure 11:
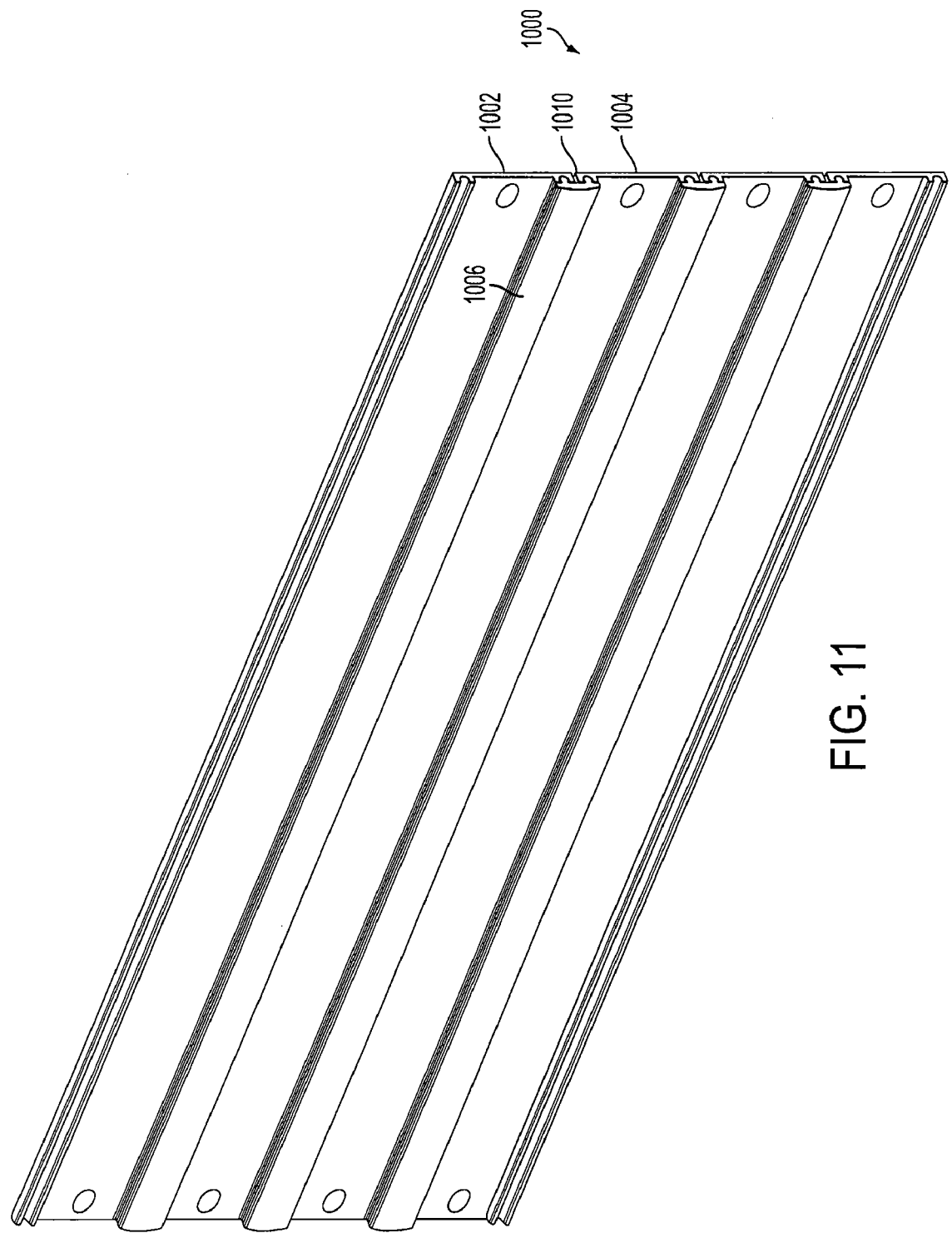
FIG. 11 is a view of a modular blocking panel system having dual-ball connecting devices.

FIG. 11 is a view of a modular blocking panel system having dual-ball connecting devices. The modular blocking panel system 1000 includes one central panel 1006 for every two outer panels, such as the top panel 1002 and the bottom panel 1004. The central panel 1006 can have a height that is smaller or larger than the outer panels. The height of the central panel 1006 is at least slightly larger than the junction 1010 between the top panel 1002 and the bottom panel 1004 in order to ensure a complete seal is made at the junction 1010. In another embodiment, the central panel 1006 can include female connectors, and can receive male connectors on the top panel 1002 and the bottom panel 1004.

Figure 12:
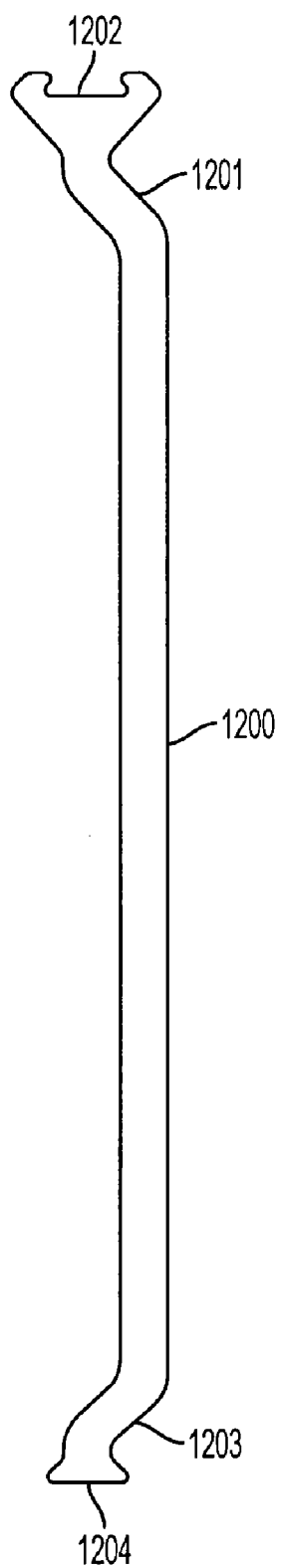
FIG. 12 is a side view of a single panel having male and female slide connecting devices.
Figure 13:
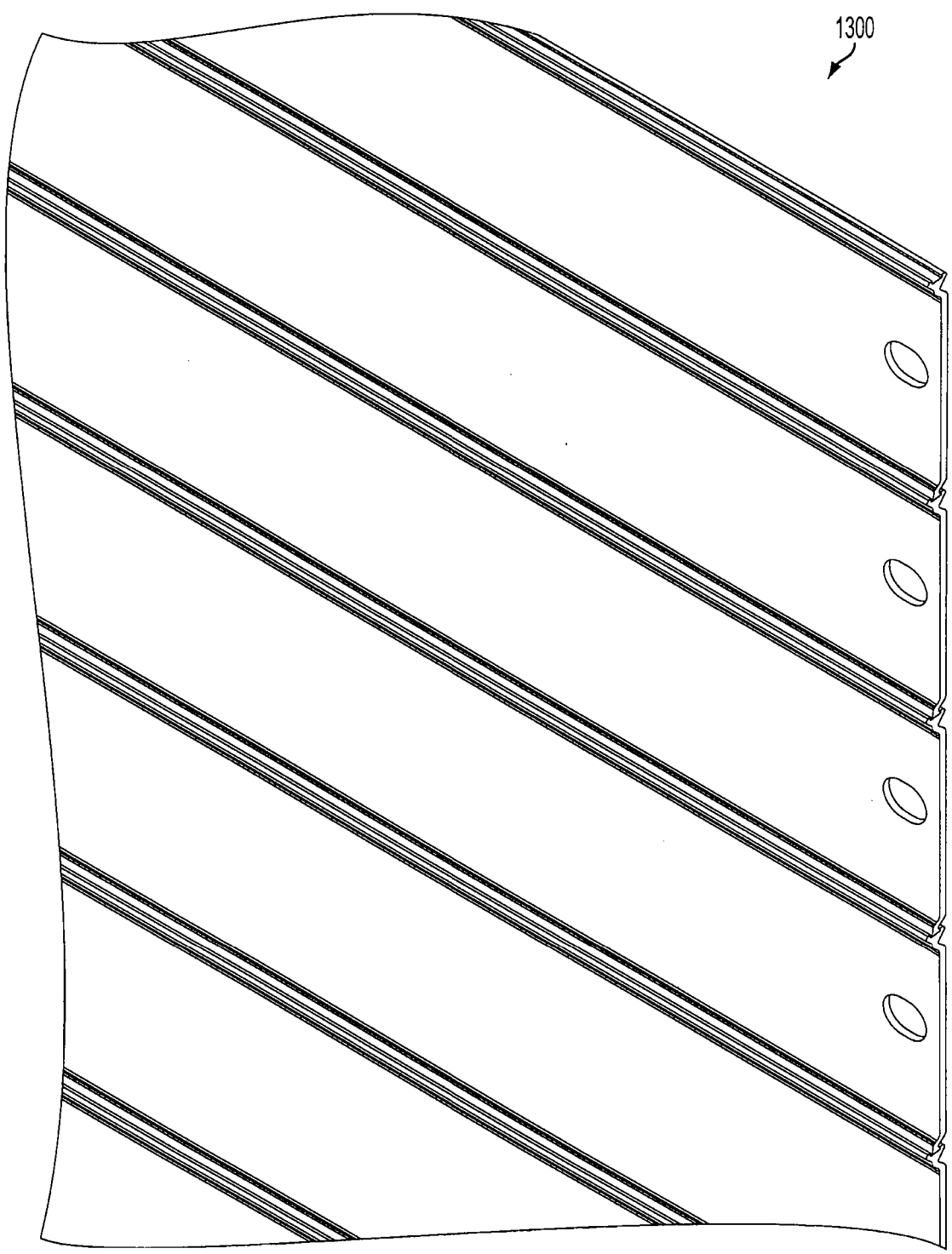
FIG. 13 is a view of a modular blocking panel system having male and female slide connecting devices.

FIG. 12 is a side view of a single panel having male and female slide connecting devices. The panel 1200 includes a female connector 1202 and a male connector 1204. The female connector 1202 is designed to slidably receive a male connector from another panel as shown in FIG. 12. The male connector 1204 is designed to be slidably inserted into a female connector from another panel to create a blocking panel 1300 as shown in FIG. 13. In an embodiment, the male connector 1204 has an anvil shape and the female connector 1202 has a complimentary shape that received the anvil-shaped male connector 1204. In another embodiment, the female connector 1202 and male connector 1204 are designed to be snap-fit or pushed, instead of being slidably attached, into their corresponding connecting members on other panels. The panel 1200 may have a first angled portion 1201 adjacent to the female connector 1202 and a second angled portion 1203 adjacent to the male connector 1204. The angled portions 1201 and 1203 make it easier to connect the female connector of one panel to the male connector of another panel.

In another embodiment, the male connector 1204 can have a circular, square, oval, rectangle, triangle, or any other geometric shape, and the female connector 1202 can have a complimentary shape to receive the male connector 1204.

While the principles of the disclosure have been illustrated in relation to the exemplary embodiments shown herein, the principles of the disclosure are not limited thereto and include any modification, variation or permutation thereof.

What is claimed is:

1. A panel for use in an equipment rack, the panel comprising:
    a body having a first connector and a second connector;
    a hinge having a first portion and a second portion, the first portion of the hinge connected to the body; and
    a rotating hinged section connected to the second portion of the hinge, the rotating hinged section having an outer connector and an inner connector and is formed in the shape of a backwards "S", the rotating hinged section movable between a closed position and an open position,
    wherein the inner connector is configured to attach to the first connector when the rotating hinged section is in the closed position for preventing movement of the rotating hinged section relative to the body.

2. The panel of claim 1, wherein the hinge is made from a flexible material.

3. The panel of claim 1, wherein the first connector snap-fits into the inner connector.

4. The panel of claim 1, wherein the body, the hinge, and the rotating hinged section together have a height of approximately 1.75 inches when the rotating hinged section is in the open position.

5. The panel of claim 1, wherein the outer connector is configured to connect the panel to another panel when the rotating hinged section is in the open position.

6. The panel of claim 1, wherein the body is made from a thermoplastic material.

7. The panel of claim 1, wherein the first connector is a male connector and the inner connector is a female connector.

8. The panel of claim 7, wherein the second connector is a male connector and the outer connector is a female connector.

9. A modular panel system comprising:
    a first panel having a top connector and a rotating hinged section, the rotating hinged section having an inner connector and an outer connector; and
    a second panel having a bottom connector,
    wherein the rotating hinged section is formed in the shape of a backwards "S" and is configured to rotate between a first position where the inner connector is removably connected to the top connector of the first panel and a second position where the outer connector is removably and non-pivotally connected to the bottom connector of the second panel.

10. The modular panel system of claim 9, wherein the rotating hinged section blocks air from passing between the first panel and the second panel when the rotating hinged section is in the second position.

11. The modular panel system of claim 9, wherein the rotating hinged section overlaps with a portion of the second panel when the rotating hinged section is in the second position.

12. The modular panel system of claim 9, wherein the first panel and the second panel form a continuous blanking panel when the outer connector is connected to the bottom connector.

13. The modular panel system of claim 9, wherein the first panel and the second panel are fire-retardant.

14. The modular panel system of claim 9, wherein the top connector is a male connector and the inner connector is a female connector.

15. The modular panel system of claim 14, wherein the bottom connector is a male connector and the outer connector is a female connector.

16. The modular panel system of claim 15, wherein the outer female connector snap-fits around the bottom male connector when the rotating hinged section is in the second position.

17. The modular panel system of claim 14, wherein the inner female connector snap-fits around the top male connector when the rotating hinged section is in the first position.

18. A modular panel system for an equipment rack, the system comprising:
    a first body having a first connector;
    a second body having a second connector;
    a rotating hinged section formed in the shape of a backwards "S" and connected to the first body and having a mating connector, the rotating hinged section configured to move between a non-mating position where the mating connector is disengaged from the second connector of the second body and a mating position where the mating connector is engaged with the second connector of the second body to non-pivotally secure the first body to the second body.

19. The modular panel system of claim 18, wherein the rotating hinged section overlaps with a portion of the second body when the rotating hinged section is in the mating position.

* * * * *